United States Patent
Jones (10) Patent No.: US 7,464,229 B1
(45) Date of Patent: Dec. 9, 2008

(54) SERIAL-WRITE, RANDOM-ACCESS READ, MEMORY

(75) Inventor: Ian W. Jones, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 387 days.

(21) Appl. No.: 11/031,367

(22) Filed: Jan. 7, 2005

(51) Int. Cl.
*G06F 13/16* (2006.01)

(52) U.S. Cl. .................................. 711/154
(58) Field of Classification Search ................ 711/154
See application file for complete search history.

(56) References Cited

U.S. PATENT DOCUMENTS

| | | | | |
|---|---|---|---|---|
| 4,912,680 | A * | 3/1990 | Masaki et al. | 365/230.09 |
| 5,123,015 | A * | 6/1992 | Brady et al. | 370/539 |
| 5,365,485 | A * | 11/1994 | Ward et al. | 365/221 |
| 2003/0007516 | A1* | 1/2003 | Abramov et al. | 370/535 |
| 2005/0080987 | A1* | 4/2005 | Zitlaw | 711/104 |
| 2006/0294483 | A1* | 12/2006 | Mukund et al. | 716/7 |

OTHER PUBLICATIONS

Ragnarok Pak-Kee Chan, "A Low Latency Asynchronous Shift Register", 2004, IEEE Transactions on Circuits and Systems—II: Express Briefs, Val. 51, No. 5, pp. 217-221.*

* cited by examiner

*Primary Examiner*—Hyung Sough
*Assistant Examiner*—Shawn Eland
(74) *Attorney, Agent, or Firm*—Park, Vaughan & Fleming LLP; Edward J. Grundler (57) ABSTRACT

A serial-write, random-access read, memory addresses applications where the data in the memory may change more frequently than would make a PROM suitable, but that changes much less frequently than would require a RAM. This enables the circuit designer to optimize the memory for fast reads, and enables reads to be pipelined. One embodiment of the present invention provides a system that facilitates a serial-write, random-access read, memory. The system includes a plurality of memory cells and a serial access mechanism for writing data into the plurality of memory cells. The system also includes a parallel random-access mechanism for reading data from the plurality of memory cells.

20 Claims, 8 Drawing Sheets

SERIAL-WRITE, RANDOM-ACCESS READ, MEMORY

BACKGROUND

1. Field of the Invention

The present invention relates to electronic storage. More specifically, the present invention relates to a method for facilitating a serial-write, random-access read, memory.

2. Related Art

Modern computer systems store massive amounts of code and data during program operation. This code and data is often stored in a cache to enable easy access from the computer system.

Much of the code and data stored in the cache (or that should be stored in the cache) is not changed very often. A standard random-access memory that stores this relatively stable code and data includes fairly complex circuitry that is able to perform both random-access reads and random-access writes to each memory cell. Note that the circuitry to perform random-access writes is infrequently used for relatively stable code and data because the relatively stable code and data is updated relatively infrequently.

One technique to simplify this write circuitry is to use a programmable read-only memory or PROM to store the relatively stable code and data. This solution, however, has drawbacks because a PROM must typically be erased using an ultraviolet light source before using a high voltage source to write new data. At the very least, this is an inconvenient process.

Another technique is to use an electrically-erasable memory, such as flash memory. While flash memory is easier to reprogram than PROM, flash memory typically requires a fabrication process that is incompatible with the fabrication process used to create the central processor and other memory devices. It is consequently impractical to integrate flash memory into semiconductor devices that include a central processor or other memory.

SUMMARY

The present invention addresses applications where the data in the memory may change more frequently than would make a PROM suitable, but that changes much less frequently than would require a RAM. This enables the circuit designer to optimize the memory for fast reads, and enables reads to be pipelined.

One embodiment of the present invention provides a system that facilitates a serial-write, random-access read, memory. The system includes a plurality of memory cells and a serial access mechanism for writing data into the plurality of memory cells. The system also includes a parallel random-access mechanism for reading data from the plurality of memory cells.

In a variation of this embodiment, the system includes a plurality of shadow latches incorporated in the plurality of memory cells. The plurality of shadow latches prevent an output from the plurality of memory cells from changing until a new set of data has been provided for the plurality of memory cells by the serial-write mechanism and a write signal has been applied that writes the data into the plurality of shadow latches.

In a further variation, data is shifted into the serial access mechanism using a synchronous clock signal.

In a further variation, data is shifted into the serial access mechanism using an asynchronous control mechanism.

In a further variation, the asynchronous control mechanism is a GasP control mechanism.

In a further variation, the system includes a balanced multiplexer for reading the plurality of memory cells, wherein the balanced multiplexer provides substantially equal delay for each data path.

In a further variation, the system includes a plurality of multiplexers configured to provide a uniform load on address wires used to select memory cells.

In a further variation, the plurality of multiplexers is arranged so that the read address decoding is pipelined, wherein the pipeline is a clocked pipeline.

In a further variation, the plurality of multiplexers is arranged so that the read address decoding is pipelined, wherein the pipeline is operated with asynchronous control

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Serial-Write, Random-Access Read, Memory

Figure 1:
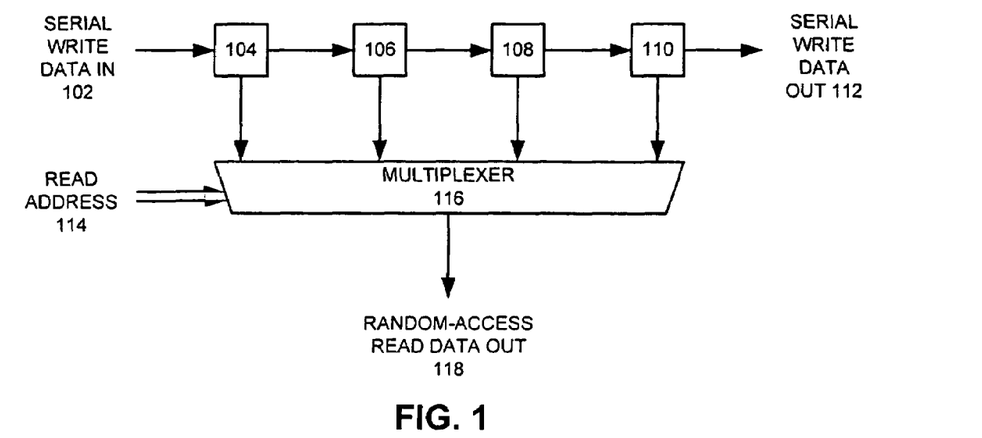
FIG. 1 illustrates a simple serial-write, random-access read, memory in accordance with an embodiment of the present invention.

FIG. 1 illustrates a simple serial-write, random-access read, memory in accordance with an embodiment of the present invention. The illustrated memory includes memory cells 104, 106, 108, and 110, and multiplexer 116. Memory cells 104, 106, 108, and 110, can hold a single bit or multiple bits such as a byte or a word.

During a write operation, serial-write data in 102 is shifted into memory cells 104, 106, 108, and 110 and shifted out as serial-write data out 112. Serial-write data out 112 can be applied to additional memory circuits.

During a read operation, read address 114 is applied to multiplexer 116 to select one of memory cells 104, 106, 108, and 110. The data stored in the selected memory cell is made available as random-access read data out 118.

Pipelined Reads

Figure 2A:
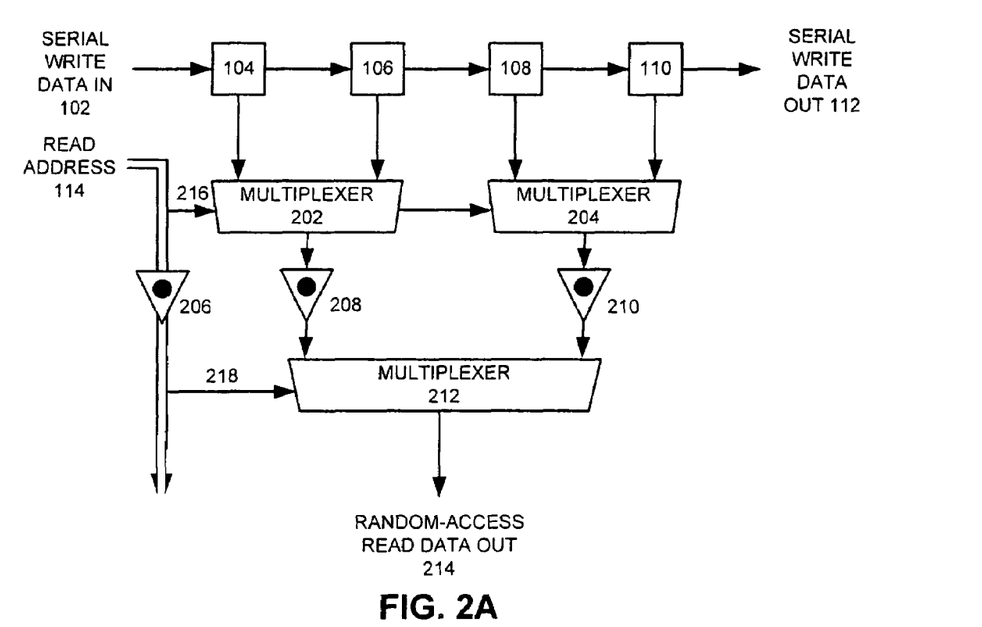
FIG. 2A illustrates a random-access read circuit for pipelined reads in accordance with an embodiment of the present invention.
Figure 2B:
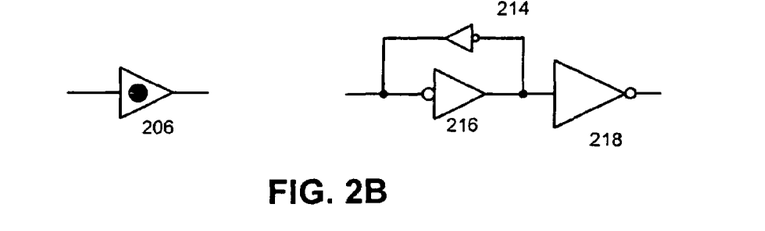
FIG. 2B illustrates an implementation of an exemplary sticky buffer in accordance with an embodiment of the present invention.

FIG. 2 illustrates a random-access read circuit for pipelined reads in accordance with an embodiment of the present invention. The illustrated memory includes memory cells 104, 106, 108, and 110, which are similar to the cells described above in relation to FIG. 1. Additionally, the illustrated memory includes multiplexers 202, 204, and 212, and sticky buffers 206, 208, and 210. Multiplexers 202, 204, and 206 are arranged as a balanced multiplexer tree, wherein each data path traverses the same number of multiplexers to random-access read data out 214. FIG. 2B illustrates an implementation of an exemplary sticky buffer 206 in accordance with an embodiment of the present invention. A sticky buffer can be implemented as a pair of inverters 214 and 216 with each of the outputs coupled to the other inverter's input followed by a third inverter 218 to drive the output. Typically the feedback inverter 214 is much smaller than the forward inverter 216. Thus, the feedback inverter 214 serves only to latch the data into the forward inverter. Write operations are identical to the write operations described above in relation to FIG. 1.

During read operations, address bit 216 from read address 114 is applied to multiplexers 202 and 204. In response, multiplexers 202 and 204 each select one of their memory inputs. The outputs from multiplexers 202 and 204 feed through sticky buffers 208 and 210, respectively. Address bit 218 from read address 114 feeds through sticky buffer 206. Note that sticky buffers 206, 208, and 210 provide storage buffers within the pipeline. Note that the pipeline can be either clocked or asynchronous.

Address bit 218 from sticky buffer 206 is applied to multiplexer 212. In response, multiplexer 212 selects either the output of sticky buffer 208 or sticky buffer 210 to become random-access read data out 214.

Figure 5A:
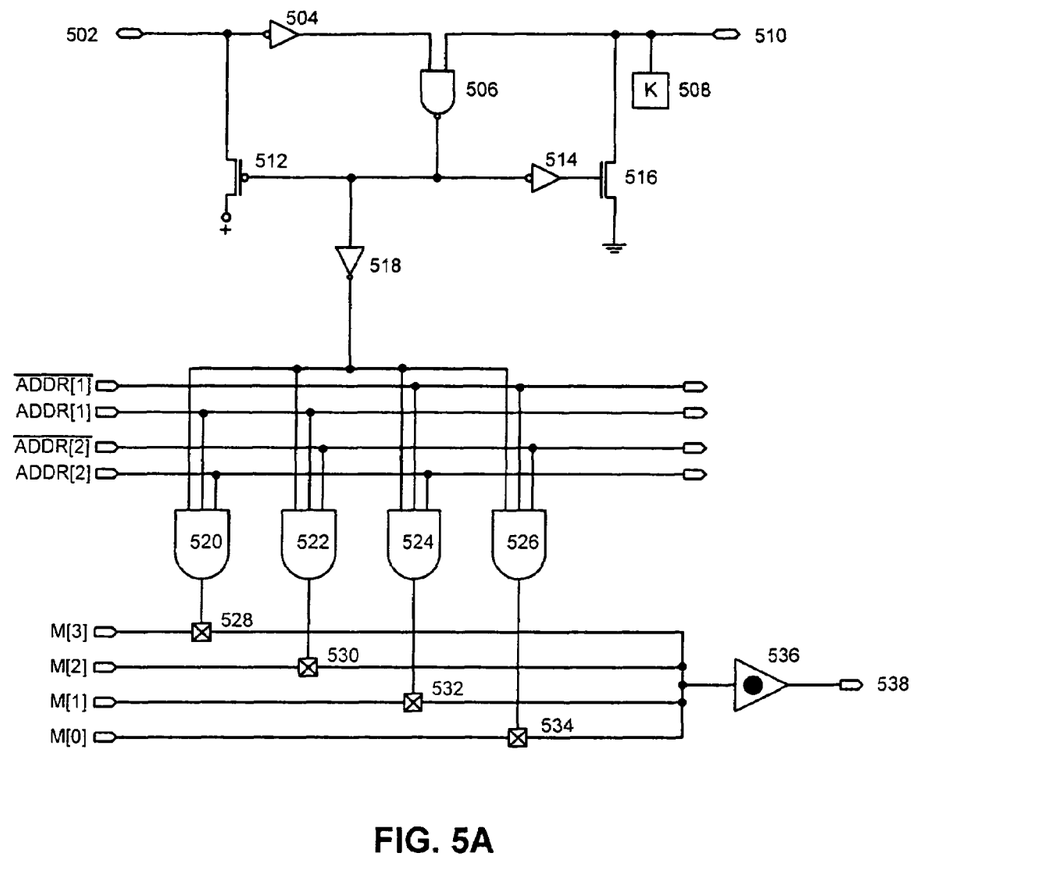
FIG. 5A illustrates a GasP-controlled 4:1 multiplexer pipeline stage in accordance with an embodiment of the present invention.

Note that the pass-gates and control signals used to coordinate data movement through the pipeline are not shown. The pass-gates can either be separate pass-gates, or they can be integrated into the multiplexer circuits. The control signals can either be clocks or asynchronous control signals. (An appropriate asynchronous control scheme using GasP control circuits is described below in relation to FIG. 5.)

Word Addressing

Figure 3:
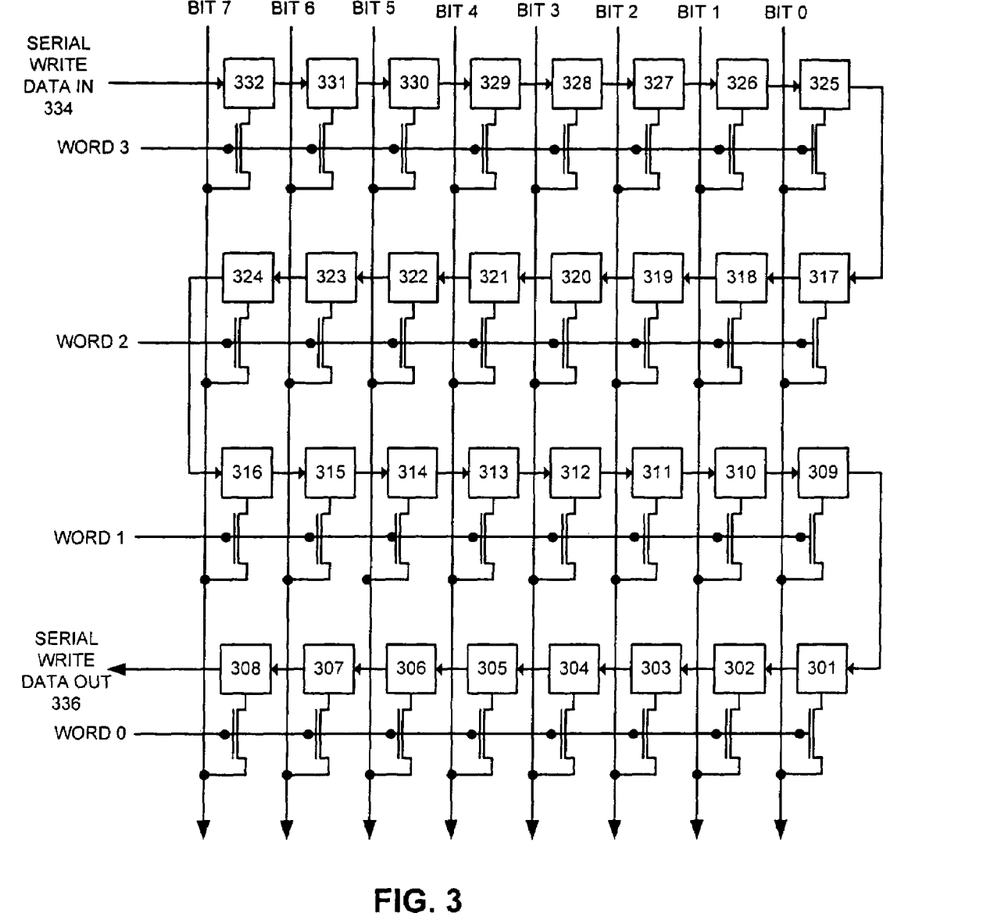
FIG. 3 illustrates a word addressing structure in accordance with an embodiment of the present invention.

FIG. 3 illustrates a word addressing structure in accordance with an embodiment of the present invention. In FIG. 3, memory cells 301-332 are coupled together to form a memory array comprising four data words of eight bits each. Serial write data in 334 is routed through a serial chain that passes through all memory cells 301-332 and continues as serial write data out 336. Serial write data out 336 can be fed into additional memory cells. During operation, code (for example, a JAVA interpreter) or data (for example, a lookup table) that is unlikely to change can be serially entered into memory cells 301-332 as serial data.

During read operations, word select lines word 0, word 1, word 2, and word 3 select one of the data words for output. The selected data word is output on bit lines bit 0 to bit 7. For example, selecting word 2 causes the data stored in memory cells 317 to 324 to appear as outputs on bit lines bit 0 to bit 7, respectively.

Uniform Load on Address Wires

Figure 4:
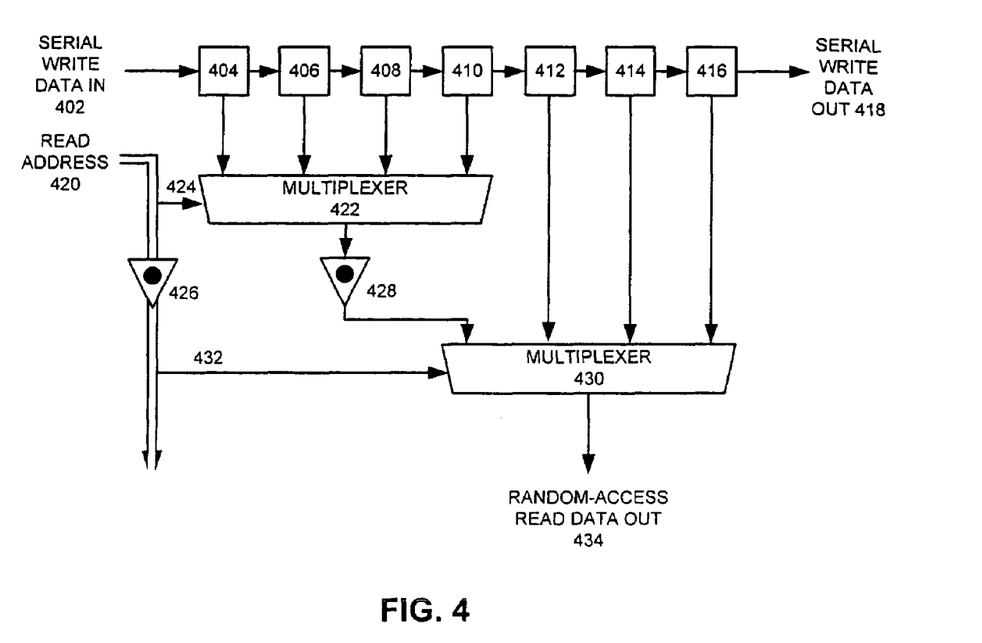
FIG. 4 illustrates a technique for providing a uniform load on address wires in accordance with an embodiment of the present invention.

FIG. 4 illustrates a technique for providing a uniform load on address wires in accordance with an embodiment of the present invention. A drawback of the balanced binary multiplex tree shown in FIG. 2 above is that there is a huge variation in loading on the address wires. For example, in FIG. 2, address bit 216 operates two multiplexers while address bit 218 operates a single multiplexer.

For large memory arrays with deeper multiplexer trees, this variation can become extremely large, which makes it difficult to operate all of the pipeline stages at the same speed. In particular, the loading at the first level of multiplexing is the highest and this loading is likely to cause a bottleneck in the pipeline stage. This is unfortunate, because if the loading at the last level (instead of the first level) were highest, then the earlier pipeline stages could be used to amplify the address signals. Note that the pipeline can be either clocked or asynchronous.

Maximum throughput for reading the memory can be achieved when all pipeline stages operate at the same speed. The speed of each pipeline stage can be made the same by use of an unbalanced multiplexer tree and the addition of extra address wires as illustrated in FIG. 4.

In the two-level multiplexing scheme illustrated in FIG. 4, an initial 3-bit address can be converted into an appropriate 4-bit address using the following operations:

1. copy bits 0 and 1 from the 3-bit address into bits 2 and 3 of the 4-bit address.
2. OR bit-2 of the 3-bit address with bits 0 and 1 of the 3-bit address and place the results into bits 0 and 1 of the 4-bit address.

Note that only seven of the eight addresses possible in the three-bit address are used. Note also that there is a trade-off between the width of the multiplexers and the number of pipeline stages. Wider multiplexers are slower because of increased wire loads and delay in address decoding logic. However, if wider multiplexers are used, fewer pipeline stages are required.

GasP Controlled Multiplexer

Figure 5B:
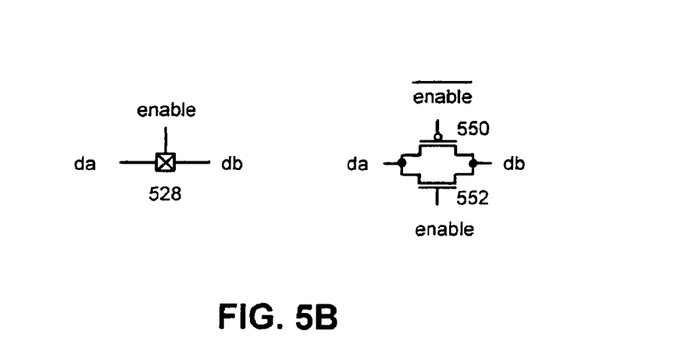
FIG. 5B illustrates an implementation of an exemplary pass-gate in accordance with an embodiment of the present invention.

FIG. 5A illustrates a GasP controlled 4:1 multiplexer pipeline stage in accordance with an embodiment of the present invention. Note that GasP modules are described in U.S. Pat. No. 6,707,317 granted to Ebergen et al., which is incorporated herein by reference. This multiplexer pipeline stage routes one of memory signals M[0] to M[3] through sticky buffer 536 to output 538. Note that address bits ADDR[1] and ADDR[2], and the inverse of these address bits are coupled to AND gates 520, 522, 524, and 526 in such a manner that a different AND gate is enabled for each of the four possible states of the two address lines. The output of AND gates 520, 522, 524, and 526 are coupled to the enable input of pass-gates 528, 530, 532, and 534, respectively. FIG. 5B illustrates an implementation of an exemplary pass-gate 528 in accordance with an embodiment of the present invention. As illustrated in FIG. 5B, pass transistor 552 is controlled by the enable signal, while pass transistor 550 is controlled by the inverted enable signal.

Figure 5C:
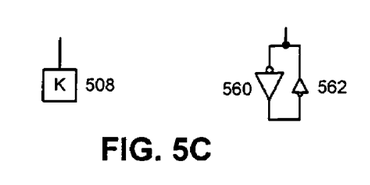
FIG. 5C illustrates an implementation of an exemplary keeper in accordance with an embodiment of the present invention.

After the address bits ADDR[1] and ADDR[2] have been set, signal 502 is brought low to enable the selected memory signal. This low signal 502 is inverted by inverter 504 and coupled to an input of NAND gate 506. The other input to NAND gate 506 is driven by keeper 508. Keeper 508 is a state-holding circuit that can be overridden by the action of transistor 516 and a transistor equivalent to transistor 512 in the following stage. Keeper 508 initially holds the second input of NAND gate 506 high. FIG. 5C illustrates an implementation of an exemplary keeper 508 in accordance with an embodiment of the present invention. Keeper 508 is comprised of back-to-back inverters 560 and 562.

The output of NAND gate 506 goes low in response to both of its inputs being high. This low signal is applied through inverter 518 to AND gates 520, 524, and 526. The output of whichever AND gate has been enabled by address bits ADDR[1] and ADDR[2] goes high in response to all of its inputs being high, thereby enabling the selected pass-gate 528, 530, 532, or 534. The output of the selected pass-gate is forwarded to sticky buffer 536, which holds the selected value after the enable signal is removed from the selected pass-gate.

The output of NAND gate 506 is also applied to transistor 512 and inverter 514. The low applied to transistor 512 causes it to conduct, thereby driving the input of inverter 504 high and causing one input of NAND gate 506 to go low. The low applied to inverter 514 causes the input of transistor 516 to go high, causing it to conduct. This causes keeper 508 to be overridden and causes the second input of NAND gate 506 to go low. Signal 510 to the following stage is also driven low.

In response to either low input, the output of NAND gate 506 goes high, which turns off transistors 512 and 516. With transistor 512 off, input 502 is held high by a keeper equivalent to keeper 508 in the previous stage. With transistor 516 off, keeper 508 maintains the low on the second input of NAND gate 506 until the following stage drives signal 510 high again. This returns the select circuitry to its quiescent state.

Clocked Serial Write Chain

Figure 6:
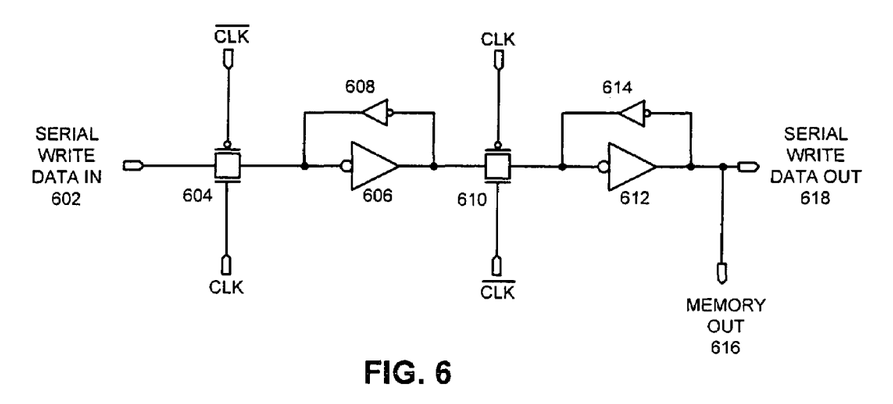
FIG. 6 illustrates a simple serial write memory chain stage in accordance with an embodiment of the present invention.

FIG. 6 illustrates a simple serial-write memory chain stage in accordance with an embodiment of the present invention. Note that the circuit of FIG. 6 forms a master-slave flip-flop. As is illustrated in FIG. 6, serial write data in 602 is applied to pass-gate 604. When CLK goes high, pass gate 604 couples serial write data in 602 to cross-coupled inverters 606 and 608. Cross-coupled inverters 606 and 608 form a latch which holds the state passed through pass-gate 604 after CLK goes low. Pass-gate 610 prevents the output of inverter 606 from being applied to the latch formed by inverters 612 and 614 while CLK is high. After CLK goes low, the output of inverter 606 is applied to inverter 612, which causes the output of inverter 612 to match the value that was applied at serial write data in 602. This output becomes serial write data out 618 and also becomes memory out 616. Note that as data is being shifted through this memory stage, memory out 616 changes with each change in serial write data in 602.

Shadow Latch

Figure 7:
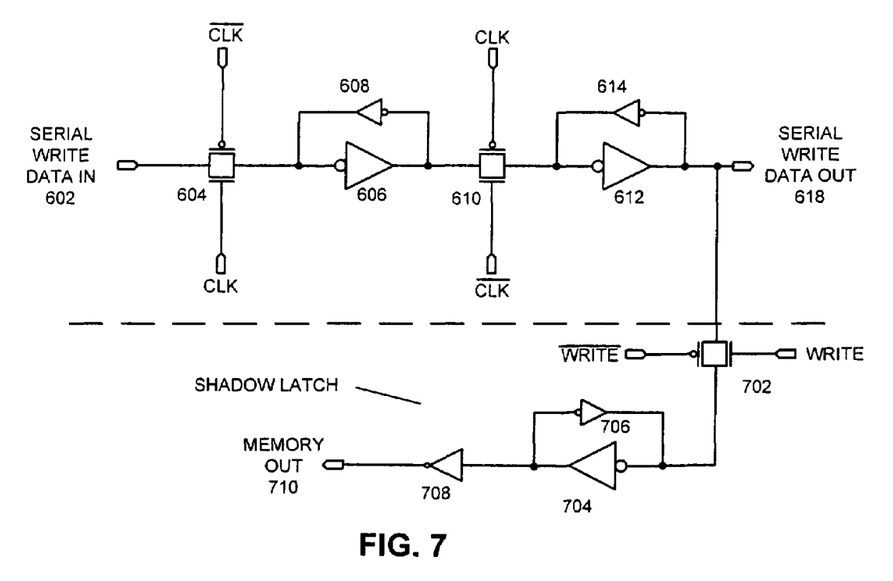
FIG. 7 illustrates a serial write memory chain stage with a shadow latch in accordance with an embodiment of the present invention.

FIG. 7 illustrates a serial-write memory chain stage with a shadow latch in accordance with an embodiment of the present invention. The shadow latch is comprised of pass gate 702 and inverters 704, 706, and 708. The serial write chain at the top of FIG. 7 operates as described above with reference to FIG. 6. However, the output of inverter 612 is prevented from changing memory out 710 by pass-gate 702. After all of the serial data has been shifted into the serial write chain, the WRITE signal is momentarily brought high which couples the output of inverter 612 to the input of inverter 704. Inverters 704 and 706 form a latch which holds the state coupled through pass-gate 702 after the WRITE signal is brought low. Inverter 708 couples the output of inverter 704 to memory out 710. Thus, memory out 710 changes only upon command from the WRITE signal.

FIFO Write, Random-Access Read

Figure 8:
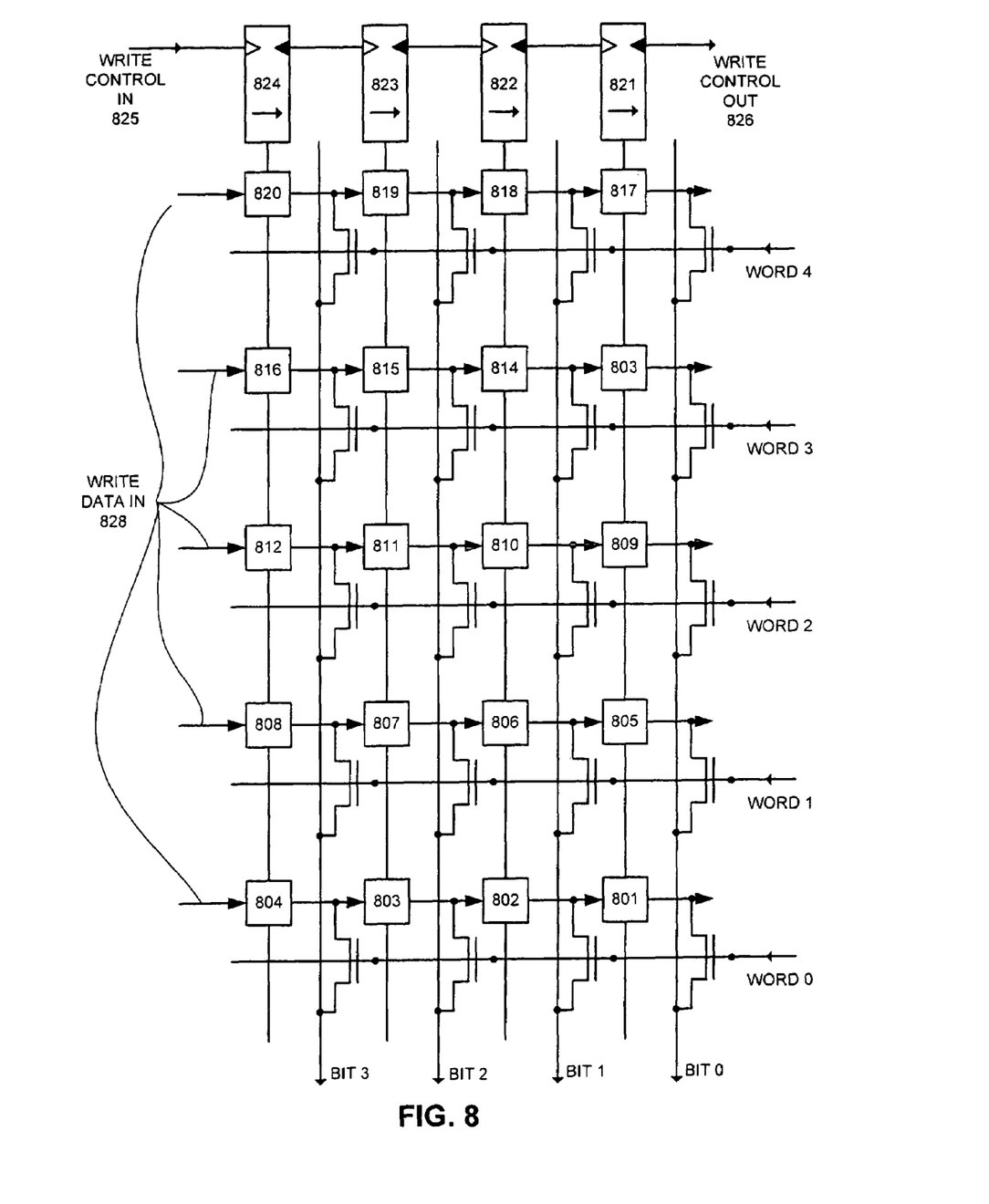
FIG. 8 illustrates a first-in, first-out write, random-access read memory in accordance with an embodiment of the present invention.

FIG. 8 illustrates a first-in, first-out (FIFO) write, random-access read memory in accordance with an embodiment of the present invention. An asynchronous FIFO can be used instead of a clocked scan chain for the serial write circuit. A potential advantage of using an asynchronous FIFO is that no global write clocks have to be distributed through the array. Another advantage of using asynchronous control is that the memory can be simpler and thus smaller-latches can be used rather than master-slave flip-flops (compare FIG. 10 with FIG. 6). Instead of distributing write clocks, local handshake signals are used to generate the latch control signals. FIG. 8 illustrates a write scheme using GasP control modules. The GasP control modules that generate the local latch control signals are shown along the top of the figure. These GasP control modules are described in more detail in conjunction with FIGS. 9A and 9B below. Write control in signal 825 is bundled with one or more serial data input wires 828. The bundled control-with-data convention uses a control signal to indicate that all bits in the data bundle are valid. Thus, there is a bundling timing constraint that the control signal must not prematurely announce that the data are valid. The GasP control circuits shown in FIG. 8 can be appropriately sized to meet the bundling constraint. Five write data in wires 828 appear in FIG. 8. However there can be more of fewer write data in wires for different implementations. Note that the data ripples from left to right through the FIFO to fill the FIFO and thus load the memory array.

Reading of this memory array can be accomplished in a number of different ways. In the implementation shown in FIG. 8, a word address scheme similar to that of FIG. 3 is shown. Address lines WORD 0 through WORD 4 run horizontally in the figure to select a particular word form the memory array. The selected word then drives the word output bit lines that run vertically. Note that with the arrangement shown, the individual bits of data words are loaded serially, but are read out in parallel.

GasP Control Module Symbol

Figure 9A:
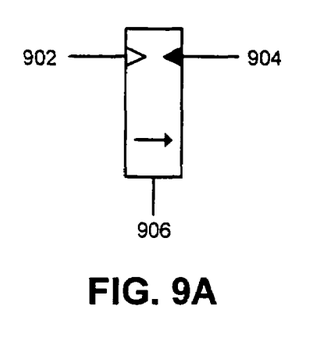
FIG. 9A illustrates a GasP control module symbol in accordance with an embodiment of the present invention.

FIG. 9A illustrates a GasP control module symbol in accordance with an embodiment of the present invention. The GasP control module operates using two signals, 902 and 904, and provides output 906. Signals 902 and 904 serve as both inputs to the GasP control module and as outputs to the preceding and following GasP control modules, respectively. The arrow indicates the forward direction of the GasP control module.

The normal quiescent state of the GasP control module is with both signals 902 and 904 high. The triangles associated with the two inputs of the GasP module in FIG. 9A indicate the initial conditions: a filled triangle indicates that the input is initially enabled, while a hollow triangle indicates an input signal event is required to enable that input. Note that both signals must be enabled before output signal 906 can respond.

GasP Control Module Circuitry

Figure 9B:
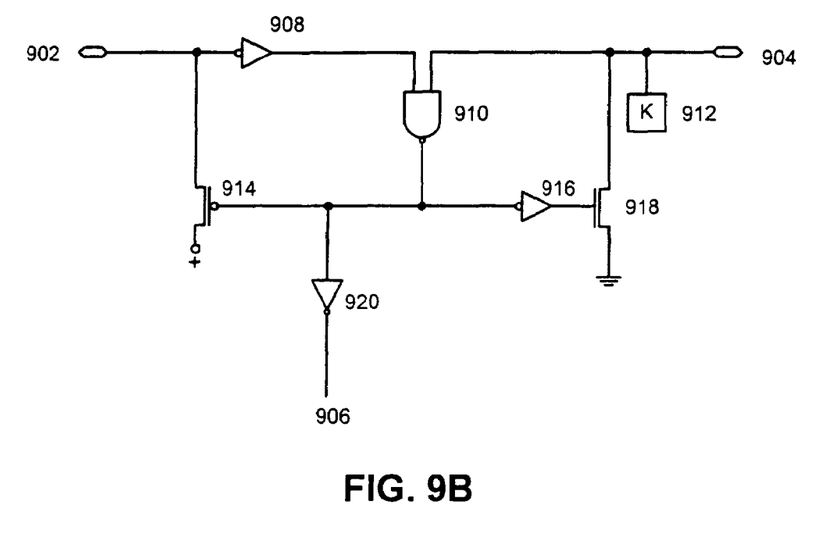
FIG. 9B illustrates an exemplary implementation of the GasP control module in accordance with an embodiment of the present invention.

FIG. 9B illustrates an exemplary implementation of the GasP control module in accordance with an embodiment of the present invention. The open triangle where signal 902 is connected indicates that a high signal conditions the GasP control module off while the filled in triangle where signal 904 is connected indicates that a high signal conditions the GasP control module on. This GasP circuit implementation uses the "low is full" encoding of control signals. Initially with no valid input data and no valid data in this stage, both signal wires 902 and 904 are high (i.e. "empty"). The high on signal 904 enables the right-hand input of the NAND gate 910, while the high on input 902 via inverter 908 disables the left-hand input of NAND gate 910. Thus, the stage is empty and waiting for valid input data. A control event indicating valid input data is then signaled by signal 902 going low. This causes the NAND gate 910 to "fire" and its output to go low, causing the latch control signal 906 to go high-thus permitting the data into the latch. The GasP module is self resetting, and signal 904 is pulled low while signal 902 is pulled high causing the NAND gate 910 to turn off again (i.e. go high). This turns signal 906 low again preventing changes of the input data from changing the data value stored in the latch (see FIG. 10 below). Keepers on signals 902 and 904 maintain this condition (of full) until the following stage has copied the data and signaled this by pulling signal 904 high, returning the state back to its initial state.

The GasP control module includes inverters 908, 916, and 920, keeper 912, NAND gate 910, and transistors 914 and 918. Keeper 912 is initialized (by circuitry not shown) to place a high on the right hand input of NAND gate 910 and also to provide a high to the next stage on line 904. Line 902 is initially held high by a keeper on a previous stage (not shown). Inverter 908 inverts the state of line 902 and applies a low to the left hand input of NAND gate 910.

The low input into NAND gate 910 causes the output of NAND gate 910 to be high. This high signal is applied to transistor 914, and inverters 916 and 920. Inverter 916 inverts this high to a low, which is applied to transistor 918. In this state, both transistors 914 and 918 are off. Inverter 920 inverts the high from NAND gate 910 and provides a low at output 906 of the GasP control module.

During operation, when a preceding stage causes input 902 to go low, inverter 908 places a high on the left hand input of NAND gate 910. This results in both inputs to NAND gate 910 being high and causes the output of NAND gate 910 to go low. Inverter 920, in response, provides a high at output 906 of the GasP control module. The low from NAND gate 910 is also applied to transistor 914 and inverter 916. The low at transistor 914 causes the transistor to conduct and reset the input to inverter 908 high. The low at inverter 916 is inverted to a high at the input of transistor 918. This high causes transistor 918 to conduct and override the state of keeper 912.

The resulting low from keeper 912 is applied to a succeeding stage on line 904. Additionally, the low is applied to the right hand input of NAND gate 910 causing its output to go high. This high signal results in the output of the GasP control going low, transistors 914 and 918 turning off, and the inputs of NAND gate 910 returning to their quiescent state.

Data Latch

Figure 10:
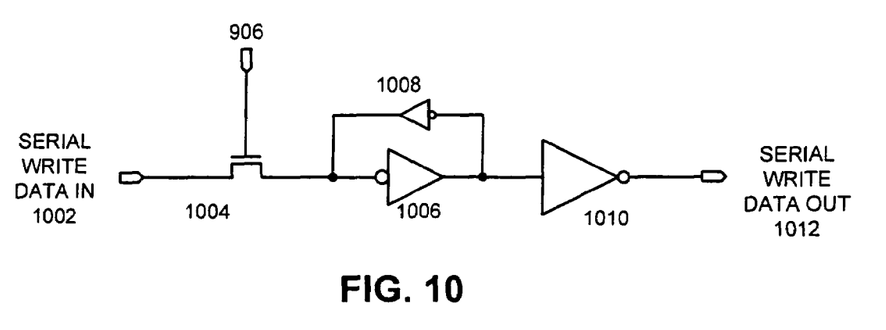
FIG. 10 illustrates a data latch circuit for the first-in, first-out write, random-access read memory in accordance with an embodiment of the present invention.

FIG. 10 illustrates a data latch circuit for the first-in, first-out write, random-access read memory in accordance with an embodiment of the present invention. When new data is available at serial write data in 1002 the GasP control module 906 provides a pulsed high to pass transistor 1004, which couples serial write data in 1002 to a latch comprised of inverters 1006 and 1008. Note that inverter 1008 is small in comparison to inverter 1006 and serves only to provide feedback and thus form a latch. The output of inverter 1006 is inverted by inverter 1010 to provide serial-write data out 1012. Note that serial-write data out 1012 is also the output of the memory cell.

Serially Storing Data

Figure 11:
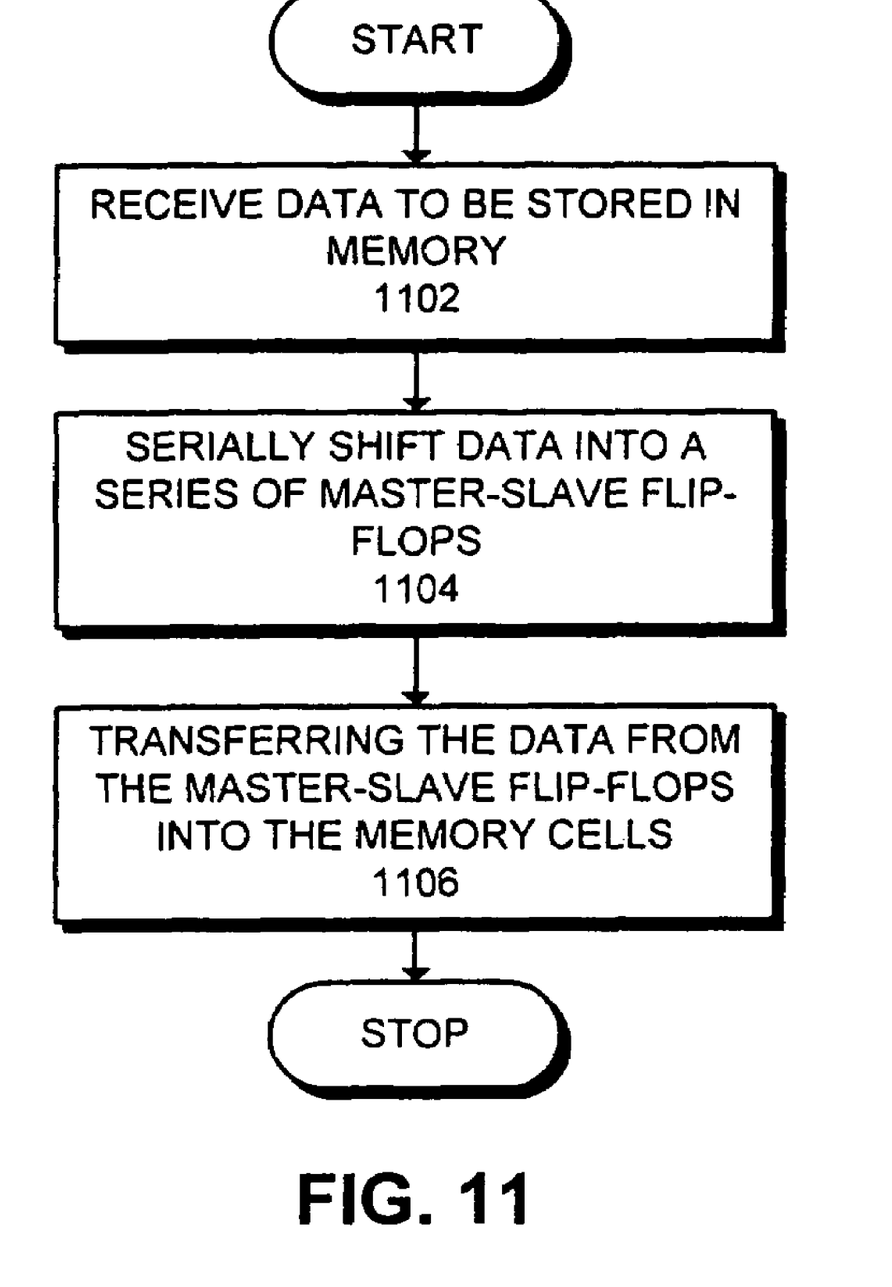
FIG. 11 presents a flowchart illustrating the process of serially storing data in memory in accordance with an embodiment of the present invention.

FIG. 11 presents a flowchart illustrating the process of serially storing data in memory in accordance with an embodiment of the present invention that uses the master-slave flip-flop and shadow latch memory cell illustrated in FIG. 7. The system starts when data to be stored in memory is received on the serial input line (step 1102). Next, the system serially shifts the data into a series of master-slave flip-flops (step 1104). Finally, the system transfers the data from the master-slave flip-flops into the shadow latches which form the memory cell (step 1106). Note that the data in the memory cells can then be accessed using random-access techniques. This technique can also use memory writing without shadow latches as shown in FIGS. 6 and 10.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that provides serial-write, random-access read, memory, comprising:
    a plurality of memory cells;
    a serial-write data path that serially couples the plurality of memory cells, wherein the serial-write data path enables writing data serially into the plurality of memory cells;
    wherein the set of memory bits that form the plurality of memory cells are connected in a single serial chain of memory bits;
    wherein writing a data word to the plurality of memory cells involves directly shifting the values for the bits of the data word into a first memory cell in the plurality of memory cells, where the first memory cell comprises a serial set of bits at the head of the single serial chain of memory bits;
    wherein writing a bit value to the head of the single serial chain shifts the values stored in all of the memory cells; and
    a parallel random-access read data path for reading data from the plurality of memory cells in parallel during a random-access read, wherein the random-access read involves selecting and returning the content of an individual memory cell in the plurality of memory cells;
    wherein a random-access read data output port receives the content of the individual memory cell from the individual memory cell during the random-access read.

2. The apparatus of claim 1, further comprising a plurality of shadow latches incorporated in the plurality of memory cells, wherein the plurality of shadow latches prevent an output from the plurality of memory cells from changing until a new set of data has been provided for the plurality of memory cells by the serial-write data path and a write signal has been applied that writes the data into the plurality of shadow latches.

3. The apparatus of claim 1, wherein data is shifted into the serial-write data path using a synchronous clock signal.

4. The apparatus of claim 1, wherein data is shifted into the serial-write data path using an asynchronous control mechanism.

5. The apparatus of claim 4, wherein the asynchronous control mechanism is a GasP control mechanism.

6. The apparatus of claim 1, further comprising a balanced multiplexer for reading the plurality of memory cells, wherein the balanced multiplexer provides substantially equal delay for each data path.

7. The apparatus of claim 1, further comprising a plurality of multiplexers configured to provide a uniform load on address wires used to select a memory cell of the plurality of memory cells.

8. The apparatus of claim 7, wherein the plurality of multiplexers is arranged so that the read address decoding is pipelined, wherein the pipeline is a clocked pipeline.

9. The apparatus of claim 7, wherein the plurality of multiplexers is arranged so that the read address decoding is pipelined, wherein the pipeline is operated with asynchronous control.

10. A method to facilitate serial-write, random-access read, memory, comprising:
    writing data to a plurality of memory cells through a serial-write data path that serially couples the memory cells in the plurality of memory cells;
    wherein the set of memory bits that form the plurality of memory cells are connected in a single serial chain of memory bits;
    wherein writing a data word to the plurality of memory cells involves directly shifting the values for the bits of the data word into a first memory cell in the plurality of memory cells, where the first memory cell comprises a serial set of bits at the head of the single serial chain of memory bits;
    wherein writing a bit value to the head of the single serial chain shifts the values stored in all of the memory cells;
    reading data from the plurality of memory cells in parallel through a parallel random-access read data path during a random-access read, wherein the random-access read involves selecting and returning the content of an individual memory cell in the plurality of memory cells; and
    receiving the content of the individual memory cell at a random-access read data output port from the individual memory cell during the random-access read.

11. The method of claim 10, wherein writing data to the plurality of memory cells involves writing data to a plurality of shadow latches incorporated in the plurality of memory cells, wherein the plurality of shadow latches prevent an output from the plurality of memory cells from changing until a new set of data has been provided for the plurality of memory cells by the serial-write data path and a write signal has been applied that writes the data into the plurality of shadow latches.

12. The method of claim 10, further comprising shifting data into the serial-write data path using a synchronous clock signal.

13. The method of claim 10, further comprising shifting data into the serial-write data path using an asynchronous control.

14. The method of claim 13, wherein the asynchronous control mechanism is a GasP control mechanism.

15. The method of claim 10, further comprising reading the plurality of memory cells using a balanced multiplexer that is configured to read the plurality of memory cells, wherein the balanced multiplexer provides substantially equal delay for each data path.

16. The method of claim 10, further comprising reading the plurality of memory cells using a plurality of multiplexers to provide a uniform load on address wires used to select a memory cell of the plurality of memory cells.

17. The method of claim 16, wherein the plurality of multiplexers is arranged so that the read address decoding is pipelined, wherein the pipeline is a clocked pipeline.

18. The method of claim 16, wherein the plurality of multiplexers is arranged so that the read address decoding is pipelined, wherein the pipeline is operated with asynchronous control.

19. A computer system to facilitate serial-write, random-access read, memory, comprising:
    a central processing unit;
    a memory manager coupled to the central processing unit;
    a plurality of memory cells;
    a serial-write data path that serially couples the plurality of memory cells, wherein the serial-write data path enables writing data serially into the plurality of memory cells under control of the memory manager;
    wherein the set of memory bits that form the plurality of memory cells are connected in a single serial chain of memory bits;
    wherein writing a data word to the plurality of memory cells involves directly shifting the values for the bits of the data word into a first memory cell in the plurality of memory cells, where the first memory cell comprises a serial set of bits at the head of the single serial chain of memory bits;
    wherein writing a bit value to the head of the single serial chain shifts the values stored in all of the memory cells; and
    a parallel random-access read data path for reading data from the plurality of memory cells in parallel during a random-access read under control of the memory manager, wherein the random-access read involves selecting and returning the content of an individual memory cell in the plurality of memory cells;
    wherein a random-access read data output port receives the content of the individual memory cell from the individual memory cell during the random-access read.

20. The computer system of claim 19, further comprising a plurality of shadow latches incorporated in the plurality of memory cells, wherein the plurality of shadow latches prevent an output from the plurality of memory cells from changing until a new set of data has been provided for the plurality of memory cells by the serial-write data path and a write signal has been applied that writes the data into the plurality of shadow latches.

* * * * *